(12) United States Patent
Amemiya et al.

(10) Patent No.: US 6,324,250 B1
(45) Date of Patent: Nov. 27, 2001

(54) EXPOSURE METHOD

(75) Inventors: Mitsuaki Amemiya, Oomiya; Shunichi Uzawa, Tokyo; Yutaka Watanabe, Tochigi-ken, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/425,224

(22) Filed: Oct. 22, 1999

(30) Foreign Application Priority Data

Oct. 27, 1998 (JP) .................................................. 10-321430

(51) Int. Cl.⁷ ...................................................... H01L 21/30
(52) U.S. Cl. ................................................. 378/34; 378/35
(58) Field of Search .................................. 378/34, 35, 70, 378/71; 430/394, 311, 322, 396, 327; 355/71, 125, 70

(56) References Cited

U.S. PATENT DOCUMENTS

| | | | |
|---|---|---|---|
| 3,823,015 | 7/1974 | Fassett | 96/36 |
| 4,440,493 | 4/1984 | Hiraga | 355/86 |
| 5,224,139 * | 6/1993 | Korenaga et al. | 378/34 |
| 5,234,781 * | 8/1993 | Sakamoto et al. | 378/35 |
| 5,262,257 * | 11/1993 | Fukuda et al. | 430/5 |
| 5,333,167 * | 7/1994 | Iizuka et al. | 378/35 |
| 5,604,779 * | 2/1997 | Amemiya et al. | 378/34 |
| 6,101,237 * | 8/2000 | Miyachi et al. | 378/35 |

FOREIGN PATENT DOCUMENTS

| | | | |
|---|---|---|---|
| 4-248520 | 9/1992 | (JP) | G02F/1/1343 |
| 2-100311 | 4/1990 | (JP) | H01L/21/27 |
| 1-150323 | 5/1989 | (JP) | H01L/21/30 |
| 63-316434 | 12/1998 | (JP) | H01L/21/30 |

* cited by examiner

Primary Examiner—Robert H. Kim
Assistant Examiner—Irakli Kiknadze
(74) Attorney, Agent, or Firm—Fitzpatrick, Cella, Harper & Scinto

(57) ABSTRACT

An exposure method for transferring a pattern of a mask onto a workpiece in a proximity exposure system, includes a first exposure step for exposing a predetermined portion of the workpiece, while maintaining a first spacing between the mask and the workpiece, and a second exposure step for exposing the predetermined portion of the workpiece, while maintaining a second spacing, different from the first spacing, between the mask and the workpiece, wherein exposures in the first and second exposure steps are performed superposedly, prior to a development process.

34 Claims, 13 Drawing Sheets

INTENSITY
DISTRIBUTION
ON RESIST

EXPOSURE METHOD

FIELD OF THE INVENTION AND RELATED ART

This invention relates to an exposure method and, more particularly, to a proximity exposure method using X-rays, for example. The exposure method of the present invention is suitably applicable to the manufacture of various microdevices such as a semiconductor chip (e.g., IC or LSI), a display device (e.g., liquid crystal panel), a detecting device (e.g., magnetic head), and an image pickup device (e.g., CCD), for example.

FIG. 1 shows an example of an x-ray proximity exposure apparatus of a known type (Japanese Laid-Open Patent Application No. 2-100311). Denoted in the drawing at 1 is an X-ray source (light emission point) such as synchrotron orbital radiation (SOR), and denoted at 2 is an SOR X-ray beam being expanded in an X direction into a slit-like shape. Denoted at 3 is a convex mirror, made of SiC, for example, for expanding the slit-like X-ray beam 2 in a Y direction. Denoted at 2a is the X-ray beam having been expanded by the convex mirror 3 into an area shape. Denoted at 7 is a workpiece to be exposed, such as a semiconductor wafer having been coated with a resist, for example. Denoted at 10 is a mask. Denoted at 4 is a beryllium film for isolating an ambience at the SOR side and an ambience at the mask (and workpiece) side from each other. Denoted at 5 is a focal plane type shutter being provided for exposure amount adjustment. In an exposure operation, the mask 10 and the workpiece 7 are placed with a spacing (gap) of about 10 microns maintained therebetween. As the shutter 5 is opened, a slit-like high-luminance x-ray beam 2 from the SOR, for example, and being expanded into an area shape (X-ray beam 2a) by the convex mirror 3, is projected to the mask 10 and then to the workpiece 7, by which a pattern image of the mask 10 is transferred to the workpiece 7 at a unit magnification.

As regards the X-rays in this case, a wavelength of about 0.5–20 nm is used. Therefore, in connection with the wavelength only, theoretically, a very high resolution of 0.05 micron (50 nm) or less will be obtainable. Practically, however, such a high-resolution mask itself is difficult to manufacture. If a mask of a nominal smallest linewidth of 0.05 micron is manufactured by use of a technique for production of a conventional mask of smallest linewidth of 0.1 micron (100 nm), any positional error or any error in the line-and-space (linewidth and spacing) of a pattern produced will be transferred to a workpiece as a mask defect. It will cause a void in the pattern to be formed, or a positional deviation of the pattern. Further, a produced mask pattern may not have a proper linewidth or a sufficient thickness. In these occasions, a sufficient contrast will not be attainable, and the pattern will not be resolved satisfactorily.

SUMMARY OF THE INVENTION

It is accordingly an object of the present invention to provide an exposure method by which a pattern can be formed at a higher resolution and a higher precision, on the basis of a currently available X-ray exposure apparatus and a mask which can be produced in accordance with a current technique.

It is another object of the present invention to provide an exposure method which enables accomplishment of resolution even in a strict condition under which the contrast is too low and the resolution is currently difficult to accomplish.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
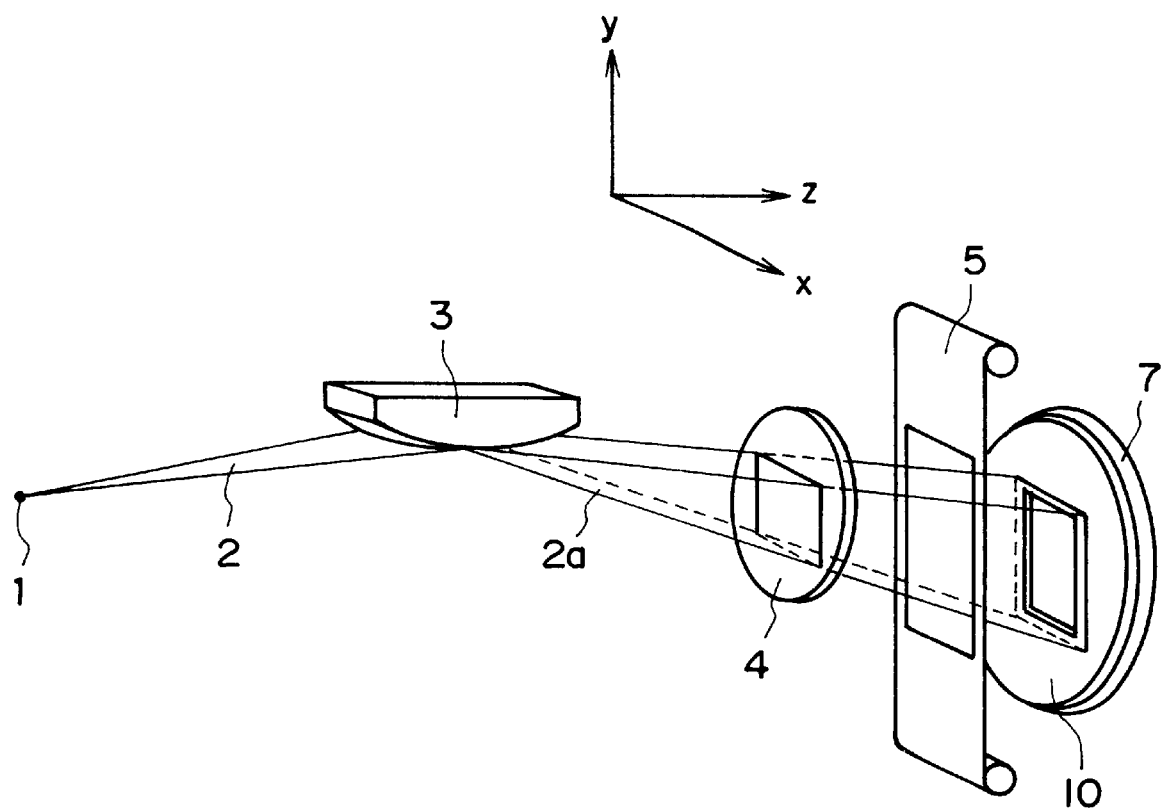
FIG. 1 is a schematic view of an X-ray proximity exposure apparatus of a known type.

Preferred embodiments of the present invention will now be described with reference to the accompanying drawings.

In one preferred form of the present invention, a fine pattern and a rough pattern are printed superposedly (superposing exposure).

A fine pattern may be a pattern like that of a diffraction grating. A diffraction image of a mask pattern having a diffraction grating shape which can be manufactured on the basis of a current technique, may be printed by exposure. This enables that, by use of a mask which can be produced by a current technique, a fine pattern having a smallest linewidth, smaller than that attainable with an ordinary X-ray exposure process, is printed at a high resolution.

As regards a rough pattern, a desired rough pattern may be printed at a location where a fine pattern should be left.

A fine pattern and a rough pattern such as described above may be exposed respectively by individual exposure amounts, each being at a level lower than the exposure amount threshold of a resist upon a workpiece but, when combined, the sum of them being at a level higher than the exposure threshold. As a result, a pattern can be formed only in such portion having been exposed superposedly. Namely, in that portion, a pattern can be formed with a precision of the fine pattern. Here, either the fine-pattern exposure or the rough-pattern exposure may be made first. A second mask for the rough pattern exposure may be one different from a first mask for the fine pattern exposure, having an absorptive member of a different material and/or a different thickness. They may be determined in accordance with conditions for accomplishing a desired rough pattern.

The fine-pattern transfer and the rough-pattern transfer may be performed with different exposure gaps. For the fine-pattern transfer, an exposure gap that satisfies a condition for interference should be selected. On the other hand, for the rough-pattern transfer, while it is not necessary to satisfy the condition of interference for the fine pattern, it is desirable to select an exposure gap that attains high pattern correctness. There may be cases where it is desirable to select an exposure gap with which a peak position of exposure intensity of a fine pattern and a peak position of exposure intensity of a rough pattern are registered with each other.

A desired rough pattern may be a pattern having a large opening or a small pattern produced in accordance with a conventional technique, for example. Alternatively, it may be a pattern based on a peak of Fresnel diffraction.

Namely, a rough pattern may be formed with an opening larger than a fine pattern, and a pattern corresponding to the position of the opening of the rough pattern may be transferred. By doing so, the contrast and precision can be improved, still on the basis of a conventional mask manufacturing technique.

There is a further advantage that a tolerance for a variation in the exposure amount or a tolerance for a variation in the exposure gap, for exposure of a small pattern (e.g., 0.05 micron line-and-space) as produced on the basis of a conventional technique (e.g., 0.1 micron line-and-space), can be enlarged. Namely, the resolution can be improved. In addition, even in a case where the contrast is too low to be resolved only through the Fresnel diffraction of a rough pattern, the exposure process may be performed while a peak of Fresnel diffraction of a rough pattern and a peak of Fresnel diffraction of a fine pattern are kept registered with each other, by which a high contrast can be assured and the resolution can be improved.

The principle of a dual exposure process according to this embodiment of the present invention will be described in greater detail, in conjunction with FIGS. 2A–4.

Figure 2A:
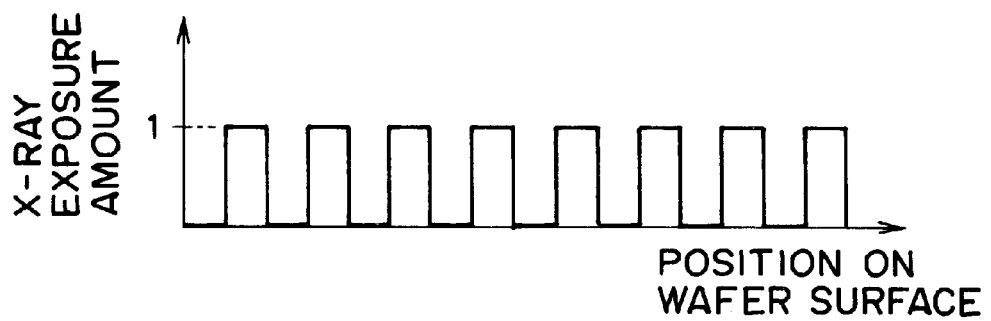
FIG. 2A is a graph of an exposure intensity distribution for a fine pattern, for explaining the principle of a dual exposure process according to an embodiment of the present invention.
Figure 2B:
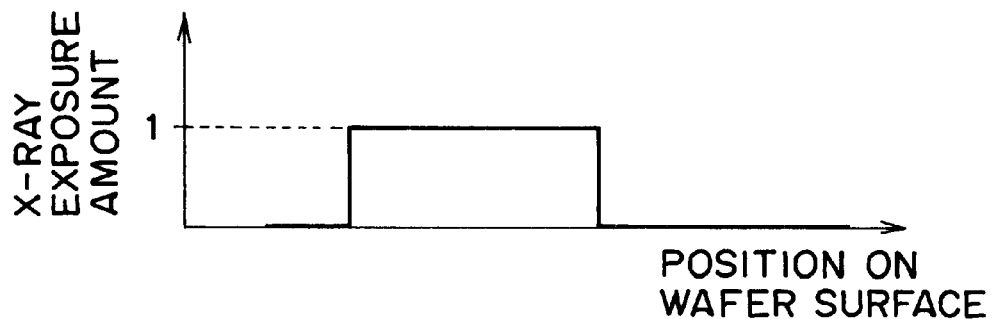
FIG. 2B is a graph of an exposure intensity distribution for a rough pattern, for explaining the principle of the dual exposure process.
Figure 3:
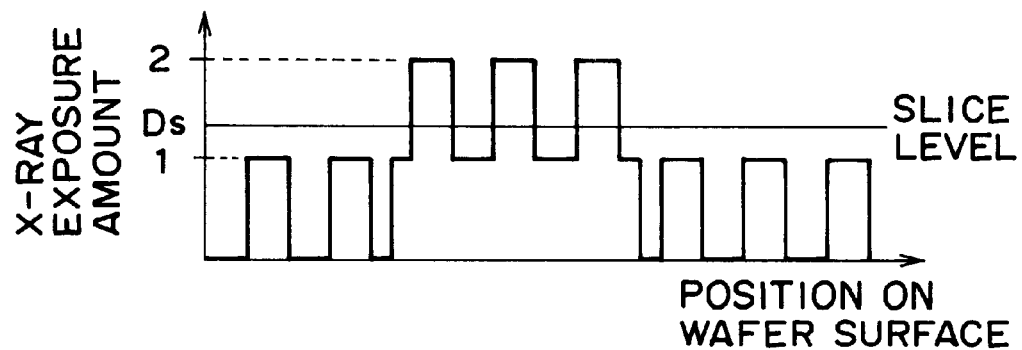
FIG. 3 is a graph of a combined exposure intensity distribution, for the fine pattern of FIG. 2A and the rough pattern of FIG. 2B.
Figure 4:
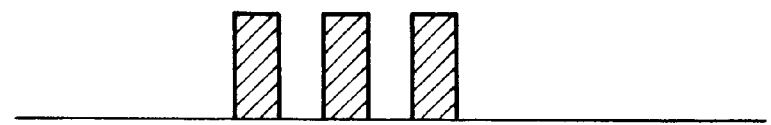
FIG. 4 is a schematic view of a resist pattern which is obtainable through an exposure process with the exposure intensity distribution of FIG. 3 and through a development process.

As an example, a fine pattern may be exposed or photoprinted with an exposure amount (1), as shown in FIG. 2A. Thereafter, as shown in FIG. 2B, a rough pattern having a linewidth corresponding to three periods of the fine pattern is photoprinted with an exposure amount (1). Then, as shown in FIG. 3, a portion where the fine pattern and the rough pattern are printed superposedly bears an exposure amount (2), whereas a portion exposed with either the fine pattern or the rough pattern only bears an exposure amount (1). The remaining portion bears zero exposure amount (0). Therefore, as shown in FIG. 3, where the exposure threshold Ds is set between the exposure amounts (1) and (2), only the portion where the fine pattern and the rough pattern are printed superposedly can be developed, as shown in FIG. 4. Here, the exposure amount (1) or (2) is referred to only for convenience in explanation, and it does not have a specific physical significance.

Figure 5:
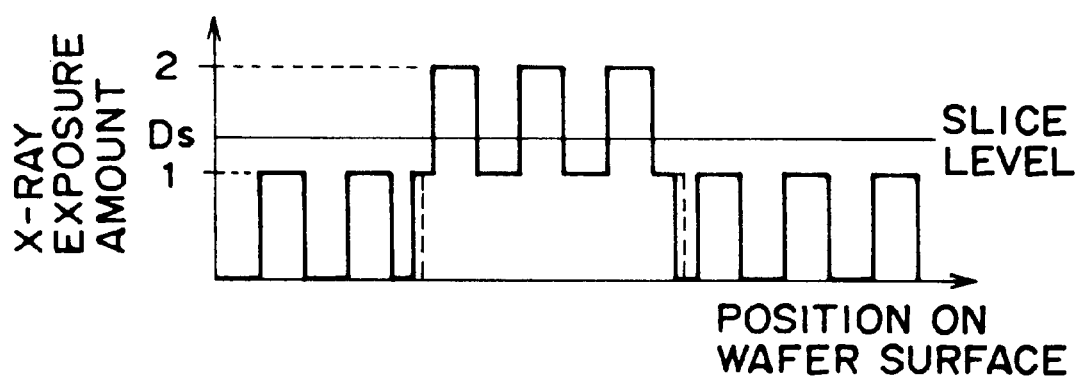
FIG. 5 is a graph of an exposure intensity distribution in a case where, in the graph of FIG. 3, the position of the rough pattern of FIG. 2B is shifted.
Figure 6:
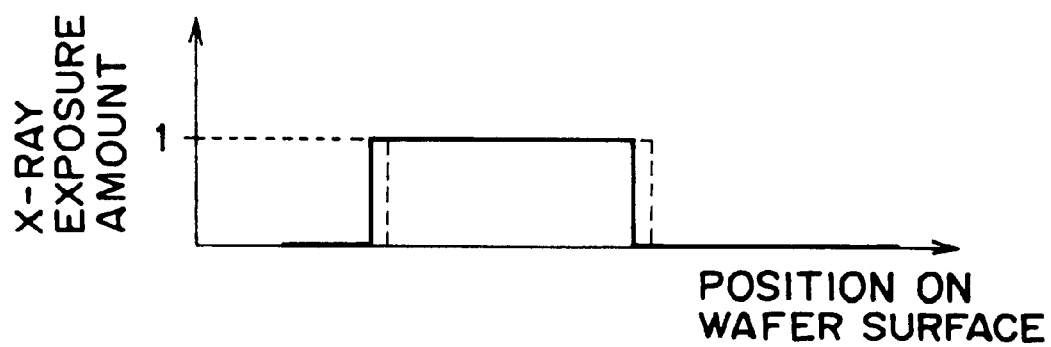
FIG. 6 is a graph of an exposure intensity distribution in a case where, in the graph of FIG. 2B, the position of the rough pattern is shifted.

Advantages of such a dual exposure process will be described below. Broken lines in FIGS. 5 and 6 depict an exposure amount distribution on an occasion when the rough pattern of FIG. 2B is printed with a deviation from the correct transfer position (solid line position) in FIGS. 5 and 6 where the pattern should be printed correctly. If the position of the rough pattern shifts such as described above, the exposure amount distribution changes slightly from the solid-line distribution to be provided correctly. However, there occurs no change in the portion to be exposed with an exposure amount (2). Namely, even if the rough pattern transfer position shifts slightly, the resist pattern after a development process can be formed exactly at the same position as in the case of FIG. 4 where the rough pattern transfer position is not deviated.

In the dual exposure process of this embodiment, an exposure region may be divided into zones in accordance with a fine pattern, and a range for divided zones may be selected in accordance with a rough pattern. The precision therefor is determined by the fine pattern, and there is substantially no influence to the precision of a pattern resulting, after development, from the rough pattern. Thus, there is a large advantage that a pattern having been manufactured in accordance with a conventional technique can be photoprinted at a high resolution, by use of a conventional X-ray exposure apparatus.

The inside area of the selected zones or a portion where only the precision or resolution for the rough pattern is sufficient, may be exposed by use of a third mask (i.e., a second rough pattern mask) for X-ray transmission, so that the exposure threshold level may be exceeded. On that occasion, the (first) rough pattern mask and the second rough pattern mask to be used for the dual exposure may be combined into a single mask, that is, a rough pattern mask having a locally adjusted transmission factor, such that a desired pattern can be produced through two exposures only.

Next, a method of producing a high resolution fine pattern by use of a mask which can be produced on the basis of a conventional technique, will be described.

Figure 7:
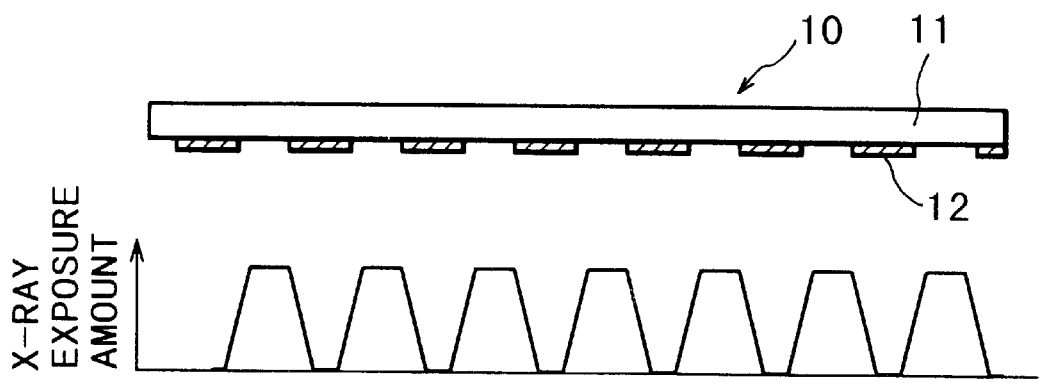
FIG. 7 is a schematic view of an example of a fine pattern mask and a fine pattern to be printed by use of that mask.

FIG. 7 is a schematic view of an example of a fine pattern mask according to an embodiment of the present invention, and a fine pattern (X-ray exposure amount) to be printed by use of that mask and through X-ray exposure. Denoted in the drawing at 10 is a fine pattern mask, and denoted at 11 is a membrane. Denoted at 12 is an X-ray absorbing material. The membrane 11 is made of a material having a high X-ray transmission factor, such as, for example, SiC or SiN of 2-micron thickness. The X-ray absorbing member 12 is made of tungsten, molybdenum or tantalum, for example. The X-ray absorbing member 12 on the membrane 11 is formed in a diffraction grating pattern (e.g., a stripe-like pattern of a regular period), whereby the fine pattern mask 10 is provided.

Here, the material and the thickness of the X-ray absorbing member 12 as well as the gap (exposure gap) between the mask 10 and a workpiece (e.g., a semiconductor wafer having a resist coating) in an exposure process, for example, may be set so that the exposure amount just below the absorbing member 12 becomes zero. As X-rays are projected under such a condition, a fine pattern (X-ray diffraction image) can be formed upon the workpiece. FIG. 7 illustrates a case where the pattern formed on the mask 10 and the fine pattern thereof (a diffraction image of the mask pattern) have the same period. Thus, if the mask pattern has a period (pitch) of 0.1 micron, the fine pattern also has a period of 0.1 micron. As regards to the period, in this case, if the line-and-space is 1:1, the linewidth is 0.05 micron which is a half of the 0.1 micron linewidth as can be attained with the conventional mask manufacturing technique. Because of the use of a diffraction image, however, errors in actual lines and spaces will be averaged, such that a fine pattern having highly uniform lines and spaces can be printed.

Figure 8:
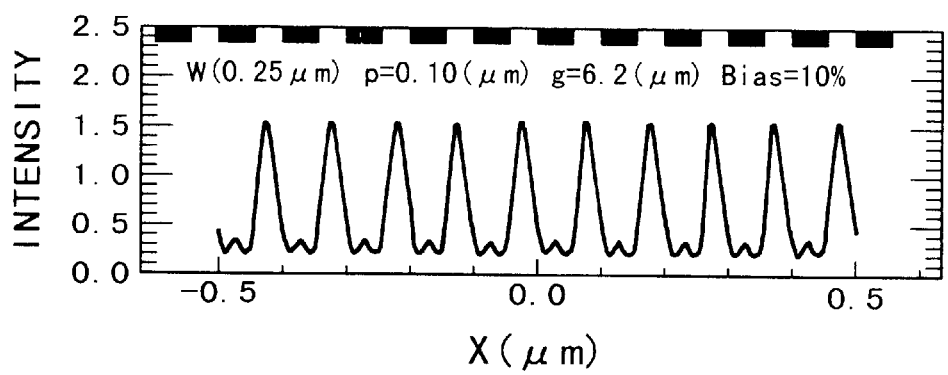
FIG. 8 is a simulation chart of an exposure intensity distribution corresponding to the state of exposure of FIG. 7.
Figure 9:
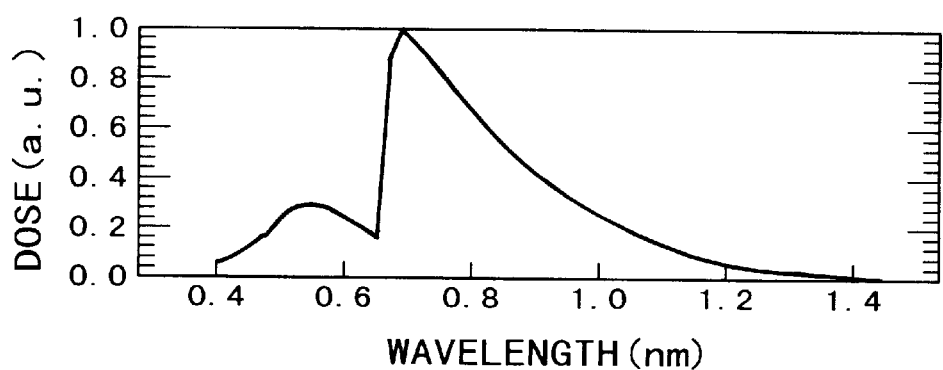
FIG. 9 is a graph of an example of an X-ray spectrum upon the surface of a workpiece to be exposed.

FIG. 8 is a graph chart of simulation of an exposure intensity (exposure amount) distribution to be absorbed by a workpiece 7 through Fresnel diffraction of X-rays, in an example where: the X-ray source 1 (FIG. 1) comprises a synchrotron orbit radiation of 585 MeV and a radius 0.593 m; the SiC mirror 3 has a glancing angle of 15 mrad; the beryllium film 4 has a thickness 18 microns; the mask 10 (FIG. 7) has a membrane 11 of 2-micron thickness SiC on which an absorbing member 12 of 0.25-micron thickness tungsten (W) is formed in a stripe-like pattern of line-and-space of a 60(nm):40(nm) ratio; and the gap (exposure gap) between the mask 10 and the workpiece 7 is kept 6.2 microns. The X-ray spectrum impinging on the mask 10 is based on the value shown in FIG. 9. It is seen also from the result of simulation that a fine linear pattern of 0.1 micron period can be produced with high contrast.

Figure 10:
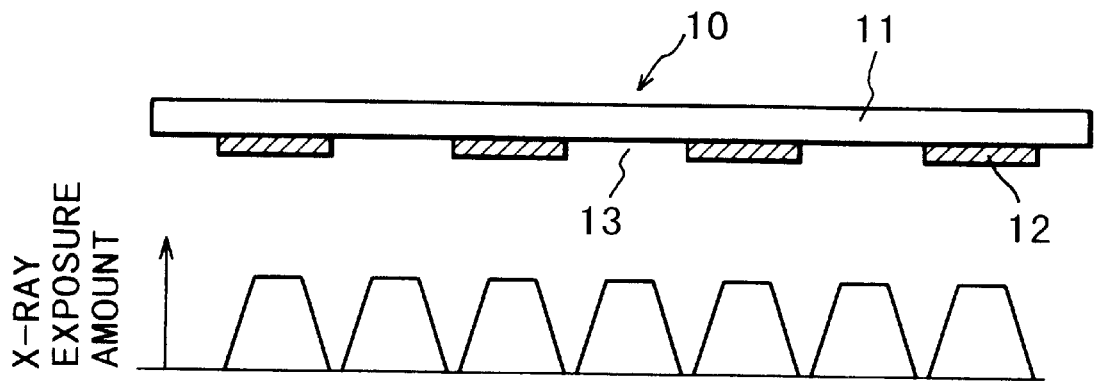
FIG. 10 is a schematic view of another example of a fine pattern mask and a fine pattern to be printed by use of that mask.

FIG. 10 is a schematic view of a mask pattern and a fine pattern, in a case for obtaining an exposure intensity distribution (fine pattern) of a ½ period (pitch) of the line-and-space of a mask pattern, on the basis of X-ray interference. In FIG. 10, the exposure gap and the thickness of the absorbing member 12 are so set that the intensity below the absorbing member 12 and the intensity below the opening 13 are at the same level. In this example, while using a mask pattern of 0.2-micron period (0.1-micron line-and-space) which can be met by a conventional technique, a fine linear pattern of 0.1-micron period (0.05 line-and-space) can be printed. Namely, by using a mask of a smallest linewidth that can be met by a conventional technique, a fine linear pattern of a half linewidth can be printed.

Moreover, a diffraction image of a 1/n period (n is an integer not less than 3) of the line-and-space of the mask, may be produced.

Figure 11:
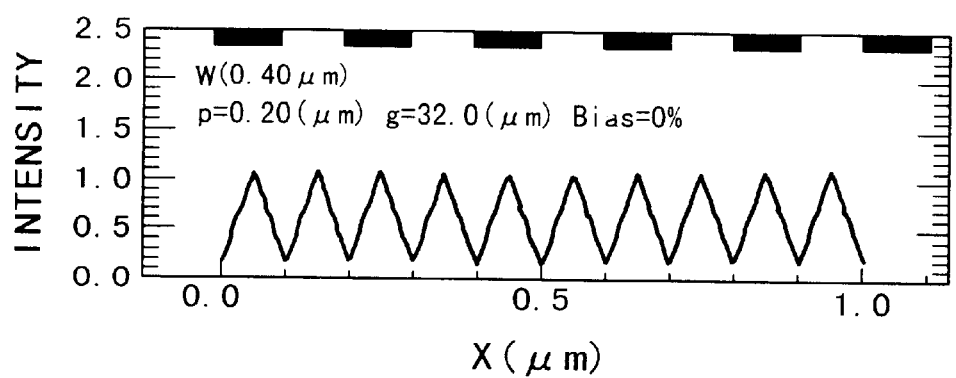
FIG. 11 is a simulation chart of an exposure intensity distribution corresponding to the state of exposure of FIG. 10.
Figure 12:
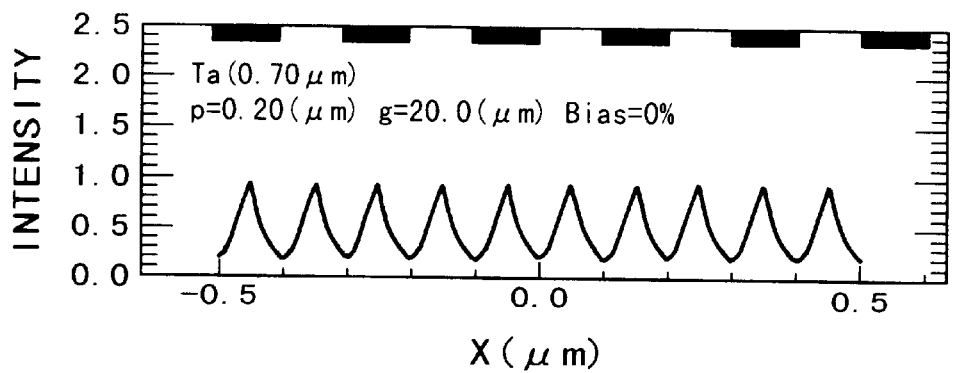
FIG. 12 is a simulation chart wherein an exposure intensity distribution to be produced by a mask having the same pattern shape as that of FIG. 10 and having an X-ray absorbing member of a different material and a different thickness, is simulated.

FIG. 11 is a graph chart of simulation of an exposure intensity (exposure amount) distribution of an X-ray diffraction image to be absorbed by a workpiece 7, under the same conditions as of FIG. 8 except that: the absorbing member 12 of the mask is made of 0.40-micron thickness tungsten; the line-and-space of the mask pattern is at a ratio of 0.1(micron):0.1(micron); and the exposure gap is 32 microns. FIG. 12 is a graph chart of simulation of a distribution (exposure amount distribution) of an X-ray diffraction image to be absorbed by a workpiece 7, under the same conditions as of FIG. 11 except that: the absorbing member 12 of the mask is made of 0.70-micron thickness tantalum (Ta); and the exposure gap is 20 microns. It is seen from the results of these simulations that, where the material and the thickness of the absorbing member 12 as well as the exposure gap are set appropriately, a fine linear pattern of 0.1-micron period can be produced with high contrast.

Figure 13:
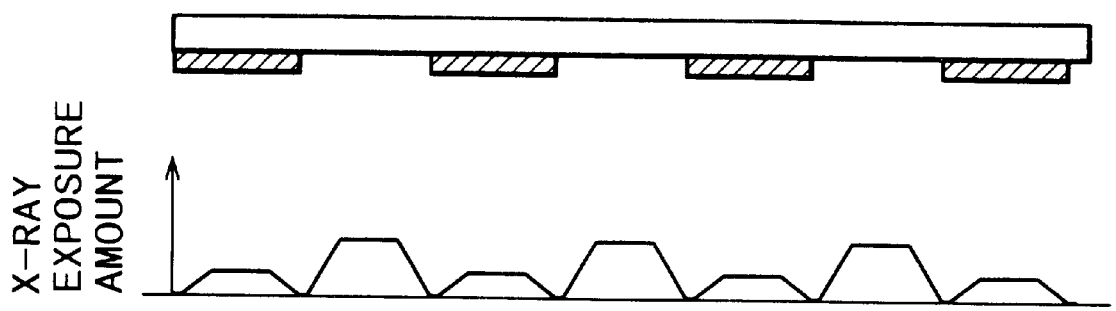
FIG. 13 is a schematic view for explaining production of a fine pattern in a case where the fine pattern of FIG. 10 is exposed with an exposure gap different from that of FIG. 10.
Figure 14:
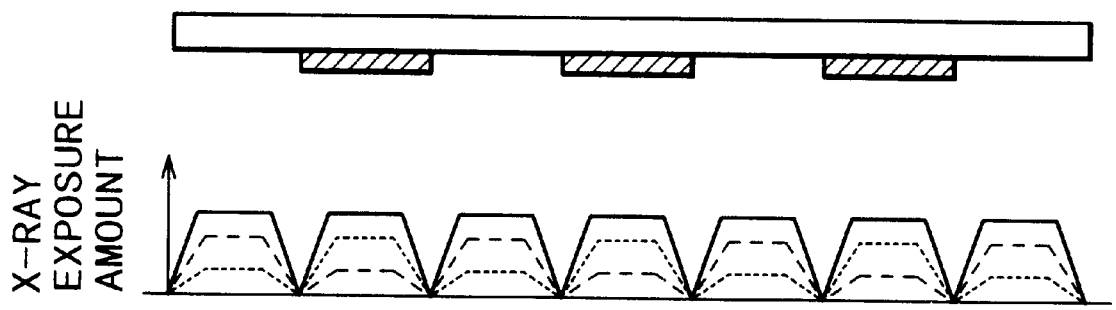
FIG. 14 is a schematic view for explaining production of a fine pattern in a case where the fine pattern of FIG. 13 and the same pattern but shifted by a half period are printed superposedly.

FIG. 13 is a schematic view of another example of a mask pattern and a fine pattern, in a case for obtaining an exposure intensity distribution (fine pattern) of a ½ period of the line-and-space of a mask pattern, on the basis of X-ray interference. In FIG. 13, the exposure gap and the thickness of the absorbing member 12 are so set that the X-ray intensity upon the workpiece, at every half period of the line-and-space of the mask pattern, becomes substantially equal to zero. In a case where the line-and-space of the mask pattern is at a unit ratio (same magnitude), they may be so selected that the intensities below the absorbing member 12 and below the opening 13 become substantially equal to zero. As regards the exposure process, the first exposure may be performed in the state shown in FIG. 13, and the second exposure may be made in the state shown in FIG. 14 wherein the mask is shifted by a half period. As a result, as shown in FIG. 14, the total exposure amount (solid line) corresponding to the sum of the amount of first exposure (dot line) and the amount of second exposure (dash line) can be made uniform.

Figure 15:
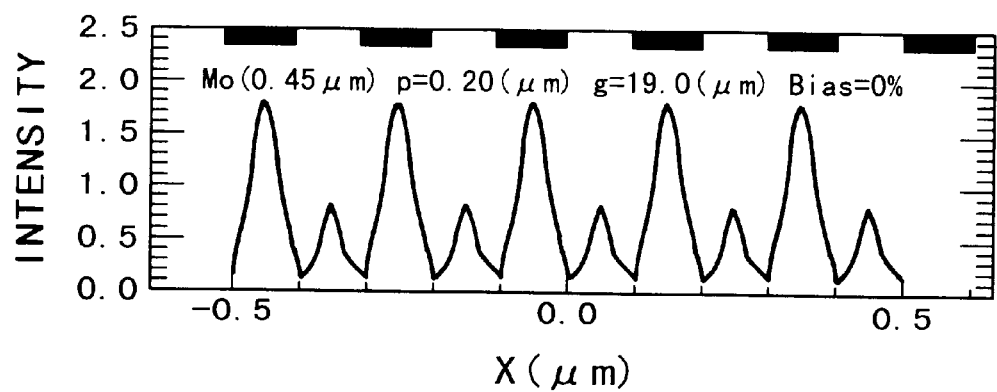
FIG. 15 is a simulation chart of an exposure intensity distribution in the state of exposure of FIG. 13.
Figure 16:
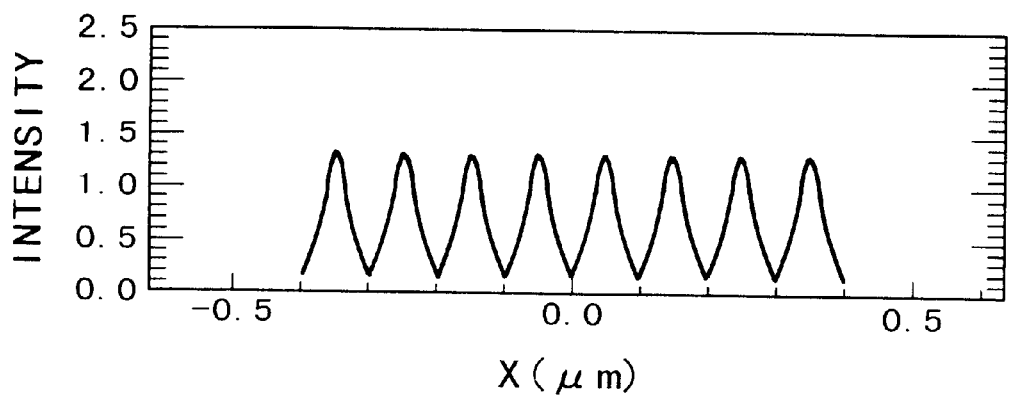
FIG. 16 is a simulation chart of an exposure intensity distribution in the state of exposure of FIG. 14.

FIG. 15 is a graph chart of simulation of an exposure intensity distribution of an X-ray diffraction image to be absorbed by a workpiece 7, under the same conditions as of FIG. 8 except that: the absorbing member 12 of the mask-is made of 0.45-micron thickness molybdenum; the line-and-space of the mask pattern is at a 0.1(micron):0.1(micron) ratio; and the exposure gap is 19 microns. FIG. 16 is a graph wherein the exposure intensity distribution of FIG. 15 and an exposure intensity distribution, resulting from shifting it by an amount corresponding to a half period of the mask pattern, are added together. As shown in FIG. 16, a uniform exposure intensity distribution can be produced.

It is to be noted here that, by setting the amounts of the first and second exposures as desired, various exposure amount distributions can be provided as desired.

Specific examples of the present invention will be described below.

FIRST EXAMPLE

A fine pattern of 0.05-micron line-and-space formed in the manner described with reference to FIGS. 13 and 14 as well as a rough pattern with a large opening as produced in accordance with a conventional method so that at least a portion where the fine pattern should be left was opened, were photoprinted respectively with exposure amounts each being at a level lower than the exposure threshold of a positive type resist upon a workpiece but, when combined, the sum of them being at a level higher than the exposure threshold. The rough pattern mask had an X-ray absorbing member of 0.5-micron thickness tungsten, having an opening of 0.375 micron width formed therein. The rough pattern was exposed by use of an exposure apparatus such as shown in FIG. 1, with an exposure gap of 10 microns. The exposure amount ratio between the fine pattern and the rough pattern was 0.5:1. The result is shown in FIG. 4, wherein a fine pattern of 0.05-micron line-and-space was left only at a desired position.

In addition to the dual exposure of the fine pattern and the rough pattern described above, a second rough pattern having an opening of 0.2-micron width was photoprinted, with the center of the 0.2-micron opening being registered with the center position of the above-described 0.375-micron width opening, and at an exposure amount ratio 1. The resist was left in a clear pattern shape of 0.25 micron in width.

Figure 17:
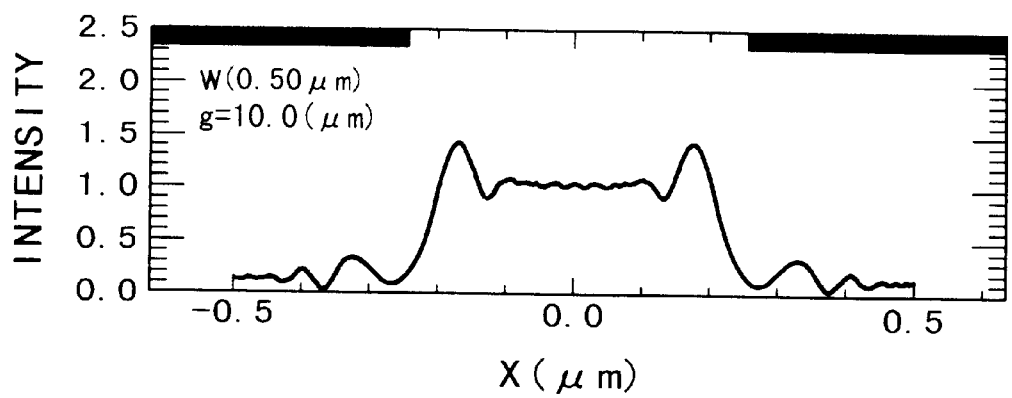
FIG. 17 is a simulation chart of an exposure intensity distribution, for explaining the state of exposure to be provided by use of a rough pattern according to a first embodiment of the present invention.
Figure 18:
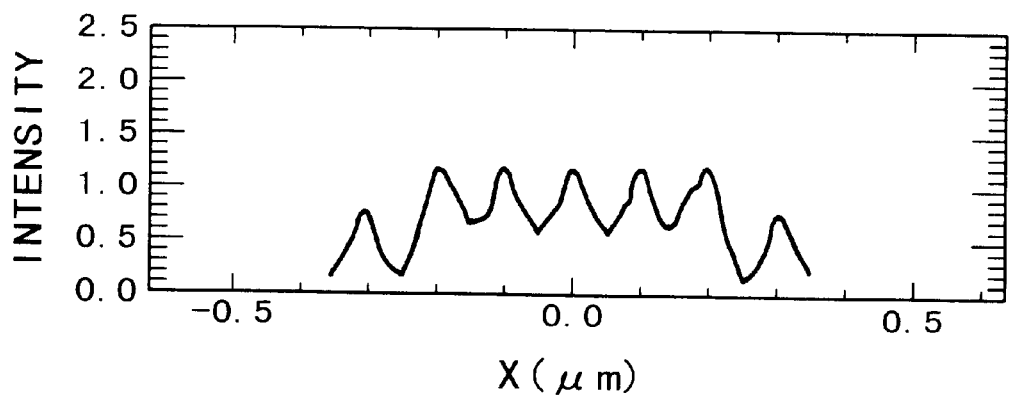
FIG. 18 is a graph of an exposure intensity distribution wherein the exposure intensity of FIG. 16 and the exposure intensity of FIG. 17 are combined with each other, at a ratio of 0.5:1.

FIG. 17 is a graph chart of simulation of an X-ray exposure amount distribution to be absorbed by a workpiece 7 in a case where: the mask has an absorbing member 12 of 0.5 micron thickness tungsten; a rough pattern having a mask pattern opening of 0.5 micron width is set at an exposure gap of 10 microns; and the exposure process is performed by use of an X-ray exposure apparatus of the conditions similar to those of the FIG. 8 example. There are peaks of exposure intensity due to Fresnel diffraction, at opposite ends of the opening of the rough pattern. FIG. 18 is a graph of a combined exposure amount distribution in an example where the fine pattern of FIG. 16 and the rough pattern of FIG. 17 are photoprinted at an exposure amount ratio of 0.5:1, while the patterns are aligned with each other so that the exposure amount peak positions of them are registered with each other. If the exposure threshold is set at an exposure intensity 1.0, five fine patterns of 0.05-micron line-and-space can be left at the opening of the rough pattern, in a good state. Namely, an edge of a mask pattern produced on the basis of a conventional technique can be fixed at the precision and resolution of a fine pattern. Therefore, the precision and resolution of a pattern to be formed can be improved.

SECOND EXAMPLE

A fine pattern of 0.05-micron line-and-space formed in the manner described with reference to FIG. 10 as well as a pattern (rough pattern) of 0.1 micron width as produced in accordance with a conventional method were photoprinted respectively with exposure amounts each being at a level lower than the exposure threshold of a positive type resist upon a workpiece but, when combined, the sum of them being at a level higher than the exposure threshold. The rough pattern mask had an X-ray absorbing member of 0.5-micron thickness tungsten, having an opening of 0.1 micron width formed therein. The exposure process was performed while the fine pattern and the rough pattern were aligned with each other so that the peak of Fresnel diffraction of the rough pattern and the peak of Fresnel diffraction of the fine pattern were registered with each other, and it was done at an exposure amount ratio of 0.5:1. The exposure gap was 10 microns.

In this example, a mask having an opening of 0.05-micron width produced by use of a conventional technique as well as a rough pattern having an opening of 0.1-micron width with which a pattern of 0.05-micron width could not be resolved when used with a conventional apparatus, due to a too low contrast, were used. Also, the exposure process was performed while keeping the Fresnel diffraction peak of the rough pattern and the Fresnel diffraction peak of the fine pattern registered with each other. Thus, by use of a mask produced in accordance with a conventional technique as well as by use of a conventional exposure apparatus, a high contrast can be attained and the resolving power can be improved thereby.

Figure 19:
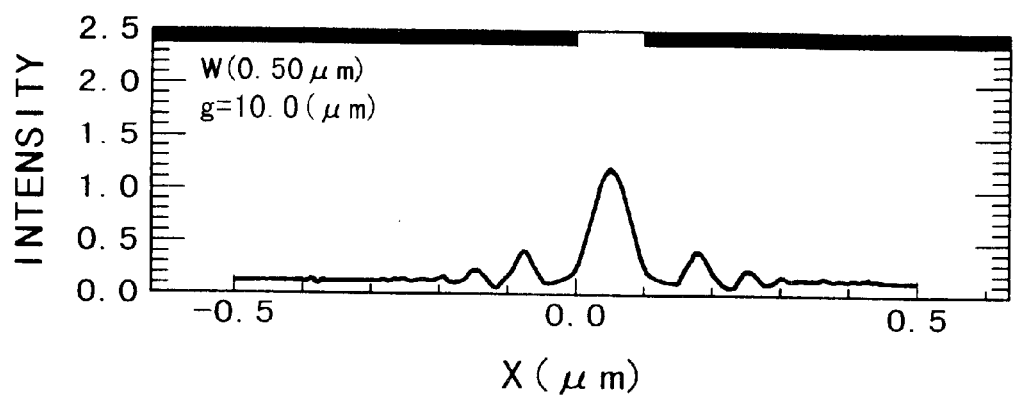
FIG. 19 is a simulation chart of an exposure intensity distribution, for explaining the state of exposure to be provided by use of a rough pattern according to a second embodiment of the present invention.
Figure 20:
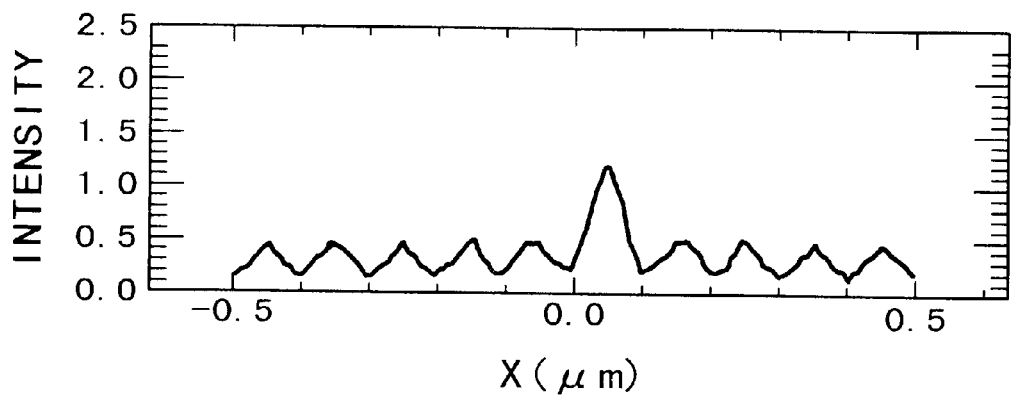
FIG. 20 is a graph of an exposure intensity distribution wherein the exposure intensity of FIG. 11 and the exposure intensity of FIG. 19 are combined with each other, at a ratio of 0.5:1.

FIG. 19 is a a graph chart of simulation of an exposure intensity distribution upon a workpiece in a case where the exposure process is performed under the conditions like those of FIG. 17, except for that the absorbing member 12 of the mask has an opening of 0.1 micron width. FIG. 20 is a graph of a combined exposure amount distribution in an example where the fine pattern of FIG. 11 and the rough pattern of FIG. 19 are photoprinted at an exposure amount ratio of 0.5:1, while the patterns are aligned with each other so that the exposure amount peak positions of them are registered with each other. If the exposure threshold is set at an exposure intensity 1.0, an isolated line of 0.05 micron (fine pattern) can be left at the position corresponding to the opening of the rough pattern, in a good state. Namely, while using a mask pattern produced in accordance with a conventional technique, a pattern that can not be resolved by a conventional method, can be resolved.

THIRD EXAMPLE

A fine pattern of 0.05-micron line-and-space formed in the manner described with reference to FIGS. 13 and 14 as well as a rough pattern as produced in accordance with a conventional method were photoprinted respectively with exposure amounts each being at a level lower than the exposure threshold of a positive type resist upon a workpiece but, when combined, the sum of them being at a level higher than the exposure threshold. The rough pattern mask had an X-ray absorbing member of 0.5-micron thickness tungsten, having an opening of 0.25 micron width formed therein. The rough pattern and the fine pattern were exposed at an exposure amount ratio of 0.5:1. The exposure gap for the rough pattern exposure was 10 microns. As a result of the above, a pattern having two lines of 0.05-micron width disposed at a spacing of 0.05 micron, was resolved, whereas the same could not be resolved by use of a conventional mask and a conventional apparatus.

Figure 21:
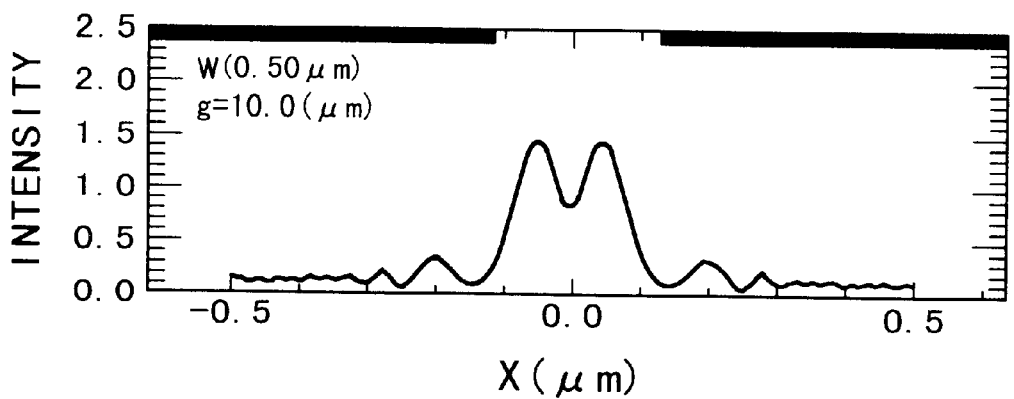
FIG. 21 is a simulation chart of an exposure intensity distribution, for explaining the state of exposure to be provided by use of a rough pattern according to a third embodiment of the present invention.
Figure 22:
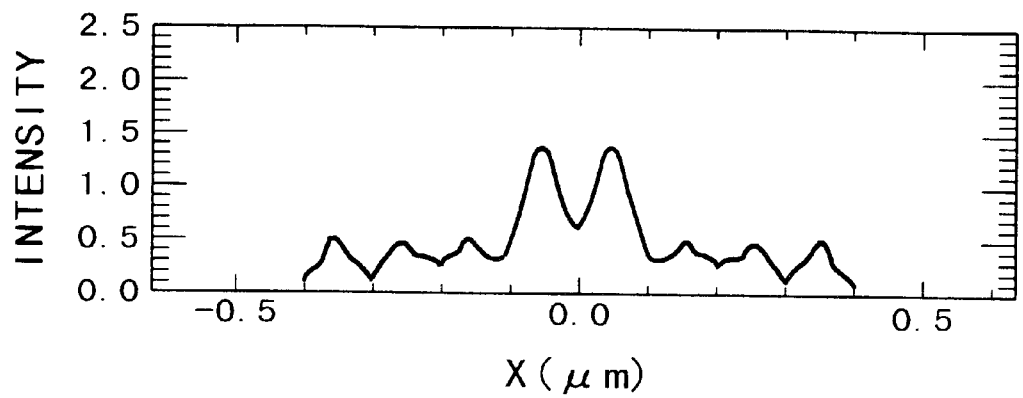
FIG. 22 is a graph of an exposure intensity distribution wherein the exposure intensity of FIG. 16 and the exposure intensity of FIG. 21 are combined with each other, at a ratio of 0.5:1.

FIG. 21 is a a graph chart of simulation of an exposure intensity distribution upon a workpiece in a case where the exposure process is performed under the conditions like those of FIG. 17, except for that the absorbing member 12 of the mask has an opening of 0.25 micron width. FIG. 22 is a graph of a combined exposure amount distribution in an example where the fine pattern of FIG. 16 and the rough pattern of FIG. 21 are photoprinted at an exposure amount ratio of 0.5:1. If the exposure threshold is set at an exposure intensity 1.0, two fine patterns of 0.05 micron width can be left at the position corresponding to the opening of the rough pattern, in a good state. Namely, while using a mask pattern produced in accordance with a conventional technique, a pattern that can not be resolved by a conventional method, can be resolved.

FOURTH EXAMPLE

A fine pattern of 0.05-micron line-and-space formed in the manner described with reference to FIG. 7 as well as a rough pattern as produced in accordance with a conventional method were photoprinted respectively with exposure amounts each being at a level lower than the exposure threshold of a positive type resist upon a workpiece but, when combined, the sum of them being at a level higher than the exposure threshold.

The rough pattern mask as designed should have an X-ray absorbing member of 0.35-micron thickness tungsten, having three openings with line-and-space of 0.05(micron)/0.05 (micron) ratio. However, the rough pattern mask actually produced had tungsten of 0.35 micron thickness exactly as designed, whereas the line-and-space of the openings was 0.06(micron)/0.04(micron) and was narrow.

A mask expected as designed can be resolved singly when Fresnel diffraction is used, like the cases of FIGS. 7 and 8. However, with use of the actually produced rough pattern singly, the pattern could not be resolved even when the Fresnel diffraction was used. But, when the fine pattern of 0.05-micron line-and-space formed in the manner described with reference to FIG. 7 and the rough pattern produced as described above, were exposed at an exposure amount ratio 0.35:1, a pattern as desired was resolved. Namely, in accordance with this example, any fault of a mask such as a production error can be compensated.

Figure 23:
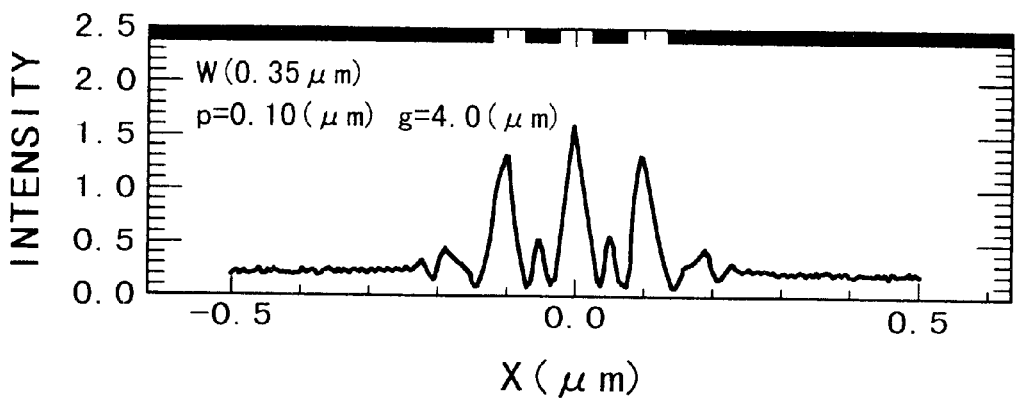
FIG. 23 is a simulation chart of an exposure intensity distribution, for explaining the state of exposure to be provided by use of an idealistic rough pattern according to a fourth embodiment of the present invention.
Figure 24:
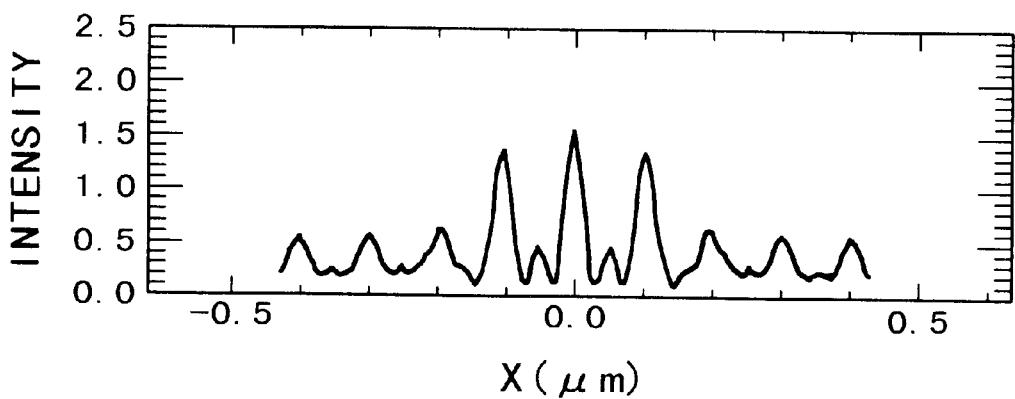
FIG. 24 is a graph of an exposure intensity distribution wherein the exposure intensity of FIG. 8 and the exposure intensity of FIG. 23 are combined with each other, at a ratio of 0.35:1.

FIG. 23 is a graph chart of simulation of the state of exposure where a mask expected as designed is used. Namely, it shows the result of simulation of an exposure intensity distribution upon a workpiece in a case where the exposure process is performed under the conditions like those of FIG. 17, except for that: the mask absorbing member 12 has a thickness 0.035 micron and has three openings of line-and-space of 0.05(micron)/0.05(micron); and the exposure gap is 4 microns. FIG. 24 is a graph of a combined exposure amount distribution in an example where the fine pattern of FIG. 8 and the rough pattern of FIG. 23 are exposed at an exposure amount ratio of 0.35:1. There is substantially no difference between the exposure distribution of FIG. 23 and that of FIG. 24.

Figure 25:
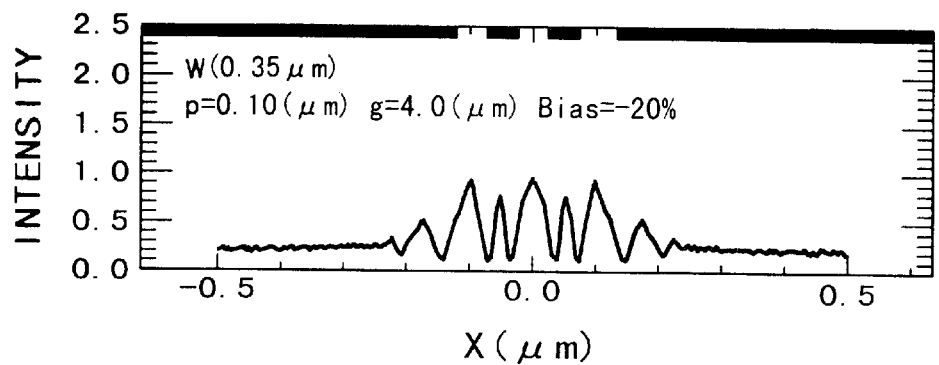
FIG. 25 is a simulation chart of an exposure intensity distribution, for explaining the state of exposure to be provided by use of a practical rough pattern according to the fourth embodiment of the present invention.

FIG. 25 is a graph chart of simulation of the state of exposure where a mask such as actually produced as described above, is used. Namely, it shows the result of simulation of an exposure intensity distribution upon a workpiece in a case where the exposure process is performed under the conditions like those of FIG. 23, except for that the line-and-space of the mask absorbing member 12 is 0.06(micron)/0.04(micron). It is very difficult to resolve three patterns.

Figure 26:
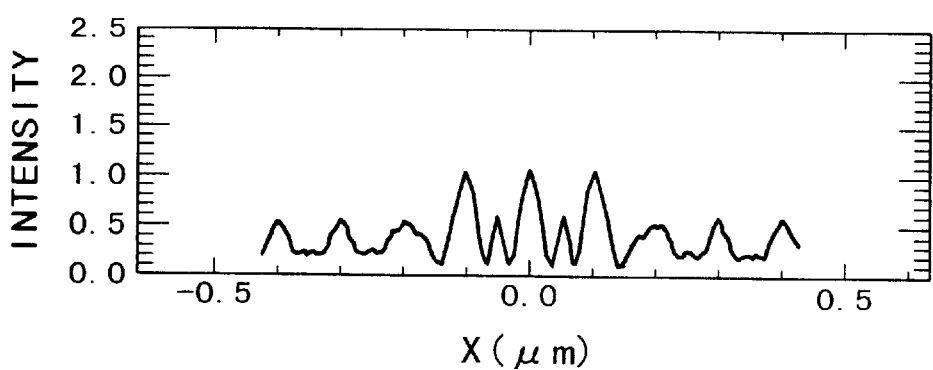
FIG. 26 is a graph of an exposure intensity distribution wherein the exposure intensity of FIG. 8 and the exposure intensity of FIG. 25 are combined with each other, at a ratio of 0.35:1.

FIG. 26 is a graph of a combined exposure amount distribution in an example where the fine pattern of FIG. 8 and the rough pattern of FIG. 25 are exposed at an exposure amount ratio of 0.35:1. If the exposure threshold is set at an exposure intensity 0.7–0.8, three fine patterns of 0.05-micron width can be left at the position of the opening of the rough pattern, in a good state. Therefore, as described above, through the dual exposure of a fine pattern and a rough pattern, a pattern which otherwise can not be resolved (or to do so is very difficult) only by use of a rough pattern, can be resolved. It is to be noted that, if the rough pattern has no fault so that it can be resolved singly, there will be no difference between the single exposure and the dual exposure, as shown in FIG. 24. In accordance with this embodiment, as described above, regardless of the presence/absence of a fault or defect in the rough pattern, a fine pattern can be formed in a good state. Thus, any fault of the mask can be compensated for.

Alternative Forms

As regards the fine pattern, in the embodiments described above, a pattern with a line-and-space (period) which is a half of that of a mask pattern is printed on the basis of the X-ray interference. However, a pattern with a line-and-space which is 1/n (where n is an integer not less than 3) of that of the mask pattern, may be photoprinted, through the X-ray interference.

The mask for a rough pattern and the mask for a fine pattern may have X-ray absorbing members of either the same material or different materials, and they may have either the same thickness or different thicknesses. In relation to the fine pattern mask, the material or thickness of the absorbing member should be selected so that an exposure intensity distribution of a period of unit magnification or 1/n magnification (n is an integer) can be produced on the basis of interference of X-rays. However, in relation to the rough pattern transfer, on the other hand, there is no necessity of satisfying the interference condition as in the case of the fine pattern. Therefore, an absorbing member and a thickness that enables high contrast, can be selected. This prevents fogging in the pattern transfer.

The exposure amount for the rough pattern and the exposure amount for the fine pattern can be determined as desired, in accordance with experiments or calculations.

Figure 27:
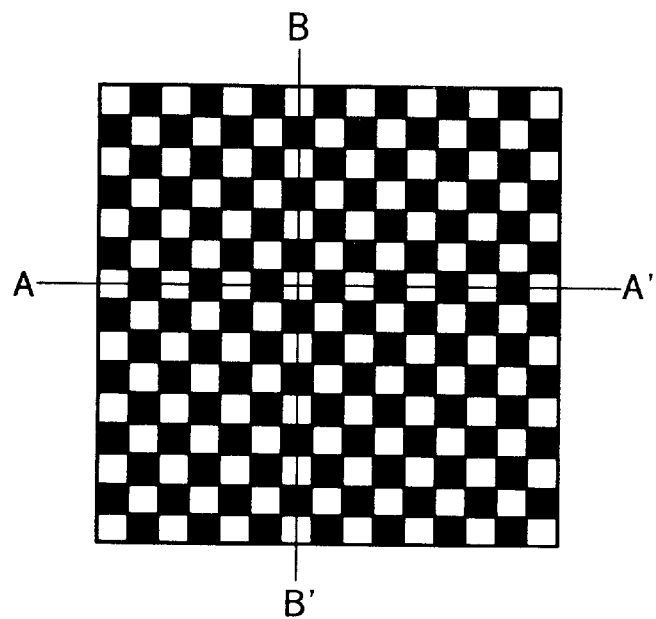
FIG. 27 is a schematic view of a checkered pattern, as another example of a fine pattern to be used in the present invention.
Figure 28:
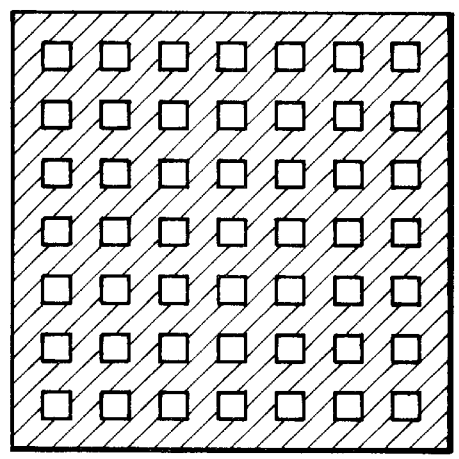
FIG. 28 is a schematic view of a grid-like pattern, as a further example of a fine pattern to be used in the present invention.

While the fine pattern comprises a stripe-like pattern in the embodiments described above, it may be a checkered pattern such as shown in FIG. 27 or a grid-like pattern such as shown in FIG. 28.

Figure 29:
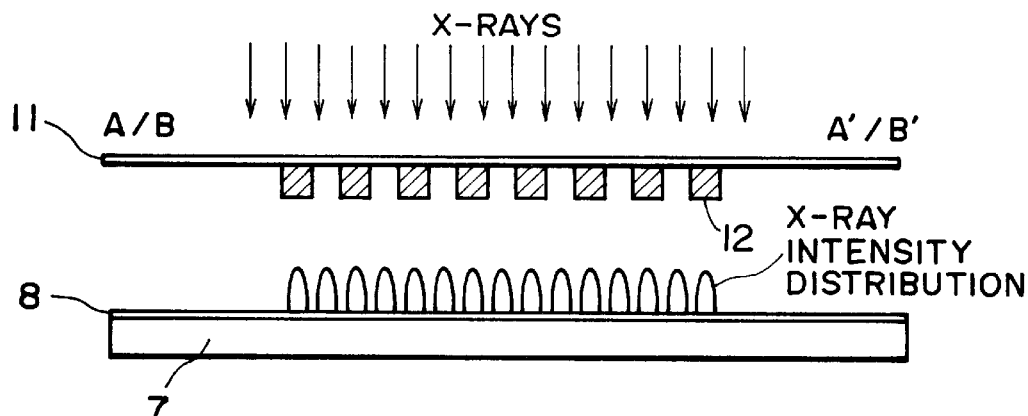
FIG. 29 is a schematic view corresponding to a section taken along a line A–A' or B–B' in FIG. 27, where an X-ray proximity exposure is performed by use of a mask having the checkered pattern of FIG. 27.

FIG. 29 is a schematic view corresponding to a section taken along a line A–A' or B–B' in FIG. 27, where an X-ray proximity exposure is performed by use of a mask having the checkered pattern of FIG. 27. Denoted in the drawing at 7 is a wafer, and denoted at 8 is a resist applied to the wafer. Denoted at 11 is a mask membrane, and denoted at 12 is an absorbing member. The waves upon the resist 8 depict an X-ray intensity distribution thereupon.

Figure 30:
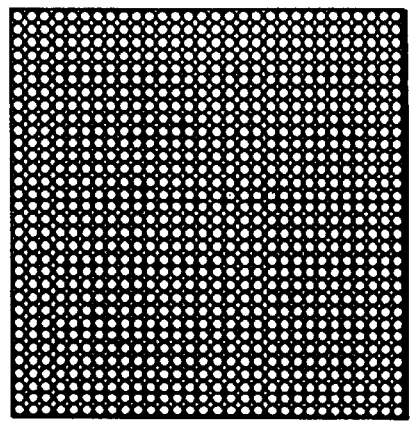
FIG. 30 is a schematic and plan view for explaining an X-ray intensity distribution upon a resist 8 of FIG. 29, to be produced by the exposure process of FIG. 29.

FIG. 30 is a schematic and plan view for explaining an X-ray intensity distribution upon the resist 8 of FIG. 29, to be produced by the exposure process of FIG. 29.

In the embodiments described above, a mask is manufactured in accordance with a conventional mask manufacturing technique, and an exposure process for the mask is performed by use of a conventional exposure apparatus. It is to be noted here that present invention can still be applied when the mask manufacturing technique is improved or the precision and resolution of an exposure apparatus is improved, and the invention can be embodied by use of such an improved mask manufacturing technique or improved exposure apparatus. Namely, while using a mask manufacturing technique and an exposure apparatus which are available at that time, a precision and a resolution, higher than those attainable with an ordinary exposure method, can be accomplished with the present invention.

Next, an embodiment of a device manufacturing method which is based on an exposure method described above, will be explained.

Figure 31:
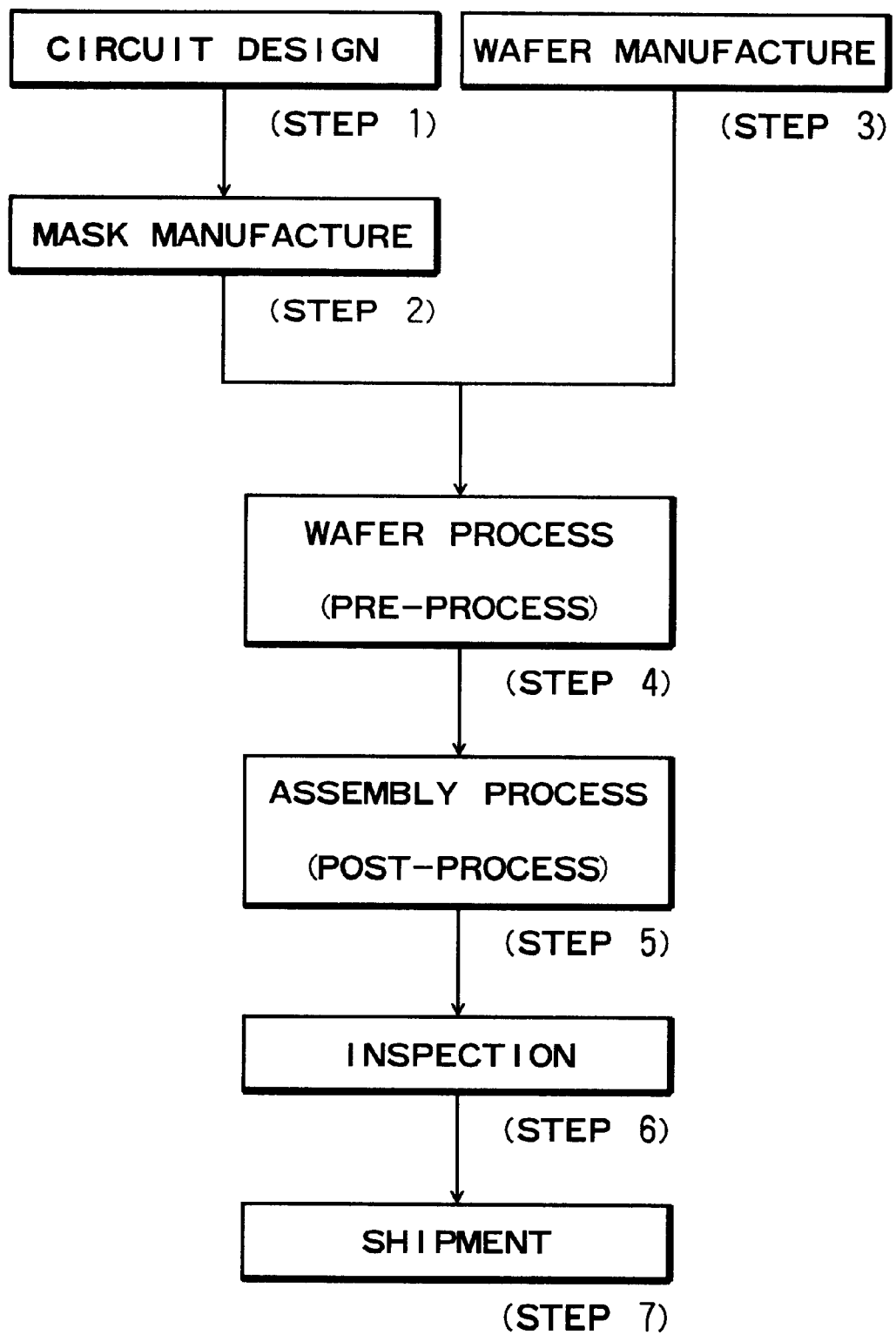
FIG. 31 is a flow chart of microdevice manufacturing processes.

FIG. 31 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembly step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7.).

Figure 32:
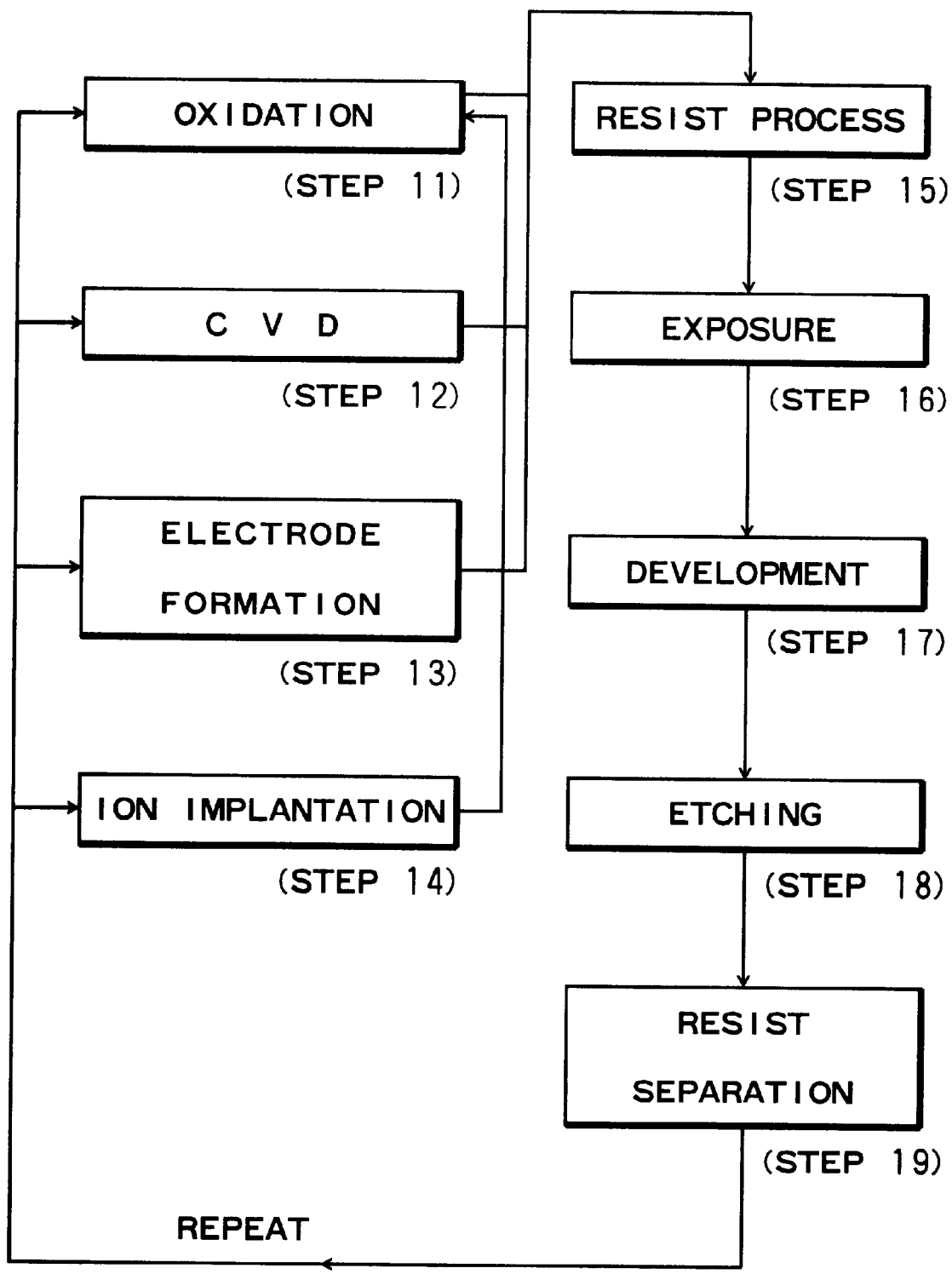
FIG. 32 is a flow chart for explaining details of a wafer process in the procedure of FIG. 31.

FIG. 32 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In the embodiments of the present invention as described above, by superposition of different exposure patterns, any manufacturing errors of mask patterns can be averaged. Also, among transferred images of different exposure patterns, a portion with a higher resolution is emphasized, by which the precision or resolution power can be improved. Further, under such conditions where the contrast is too low and resolution is difficult to accomplish when a conventional mask and a conventional exposure method are used, the present invention enables the resolution.

As described, the present invention enables a higher precision and a higher resolution by use of an ordinary mask manufacturing method and an ordinary exposure apparatus which are available at that time (currently or in the future), than the precision or resolution attainable simply with such a mask manufacturing method or an exposure apparatus.

A fine pattern of smallest linewidth less than the resolution limit, attainable with a combination of an ordinary exposure apparatus and a currently available mask, may be printed on the basis of the interference of X-rays. This may be combined with exposure of a rough pattern as can be produced by use of a currently available mask manufacturing technique. The fine pattern exposure and the rough pattern exposure may be performed respectively at individual exposure amounts, each being at a level lower than the exposure amount threshold of a resist upon a workpiece but, when combined, the sum of them being at a level higher than the exposure threshold. This enables resolving a smallest linewidth of the fine pattern. There are various advantageous effects involved, such as follows.

(1) Since the final pattern position strongly depends on the transfer position of the fine pattern, there occurs substantially no positional error provided that the transfer position of the fine pattern is correct.

(2) Since the final pattern image strongly depends on a transferred image of the fine pattern, a defect in the rough pattern, if any, is not easily transferred provided that the transferred image of the fine pattern is uniform.

(3) Since the transferred image of the fine pattern is formed through interference between plural patterns, a particular defect in the fine pattern mask, if any, is not substantially transferred.

While the invention has been described with reference to the structures disclosed herein, it is not confined to the details set forth and this application is intended to cover such modifications or changes as may come within the purposes of the improvements or the scope of the following claims.

What is claimed is:

1. A device, comprising:
    a substrate; and
    a circuit pattern formed on said substrate in accordance with a procedure which includes (i) transferring a pattern of a mask onto a workpiece in a proximity exposure system, including (a) a first exposure process for exposing a predetermined portion of the workpiece, while maintaining a first spacing between the mask and the workpiece, and (b) a second exposure process for exposing the predetermined portion of the workpiece, while maintaining a second spacing, different from the first spacing, between the mask and the workpiece, wherein exposures in the first and second exposure processes are performed superposedly, prior to a development process, and (ii) developing the workpiece having said pattern transferring step performed thereto, whereby a circuit pattern can be produced on the developed workpiece.

2. An exposure method using a proximity exposure system, said method comprising:

a first exposure step for exposing a predetermined portion of a workpiece, while maintaining a first spacing between a first mask and the workpiece, to form an image of the first mask at a predetermined position on the workpiece, wherein the first mask and the image of the first mask include a periodic pattern portion, and the period of the periodic pattern portion of the image of the first mask is substantially equal to 1/n times the period of the periodic pattern portion of the first mask, wherein n is an integer not less than 2; and a second exposure step for exposing the predetermined portion of the workpiece, while maintaining a second spacing different for the fist spacing, between a second mask and the workpiece, wherein exposures in the first and second exposure steps are performed superposedly, prior to a development process.

3. A method according to claim 2, wherein said first and second exposure steps use first and second masks, respectively, which are different from each other.

4. A method according to claim 2, wherein the first mask used in said first exposure step comprises a transmissive membrane and an absorbing material member formed on the membrane in one of a line-and-space pattern, a checkered pattern and a grid-like pattern.

5. A method according to claim 2, wherein a first region having an exposure amount less than an exposure threshold value is produced by said first exposure step, a second region having an exposure amount less than the exposure threshold value is produced by said second exposure step and at least a portion of a third region in which the first and second regions are superposed one upon another has an exposure amount greater than the exposure threshold value.

6. A method according to claim 2, wherein the image of the first mask is formed on the basis of Fresnel diffraction.

7. A method according to claim 2, wherein the first exposure step is carried out plural times while shifting the position of the first mask.

8. A method according to claim 2, wherein at least one of said first and second exposure steps is performed by use of X-rays.

9. A device manufacturing method, comprising the steps of:

performing an exposure process to a workpiece, as recited in claim 2; and developing the exposed workpiece, for forming a circuit pattern on the developed workpiece.

10. A method according to claim 9, wherein at least one of said first and second exposure processes is performed by use of X-rays.

11. A method according to claim 2, wherein the first and second masks are the same mask.

12. A method according to claim 2, wherein the first and second masks are different masks.

13. A device, comprising:

a substrate; and a circuit pattern formed on the substrate through a procedure including (i) an exposure process to a workpiece as recited in claim 11, and (ii) a development process for developing the exposed workpiece, whereby a circuit pattern is formed on the developed workpiece.

14. An exposure apparatus for performing exposure by use of an exposure method as recited in claim 2.

15. An x-ray proximity exposure apparatus, having a shutter for adjusting an exposure amount of X-rays from an X-ray source, which reach a workpiece, wherein said X-ray proximity exposure apparatus performs exposure of the workpiece in accordance with an exposure method as recited in claim 2.

16. An exposure method using a proximity exposure system, said method comprising:

a first exposure step for exposing a predetermined portion of a workpiece, while maintaining a first spacing between a first mask and the workpiece;

a second exposure step for exposing the predetermined portion of the workpiece, while maintaining a second spacing, different from the first spacing, between a second mask, and the workpiece, wherein the second mask has a smallest linewidth which is at least twice a smallest linewidth of an image of the first mask.

17. A method according to claim 16, wherein said first and second exposure steps use first and second masks, respectively, which are different from each other.

18. A method according to claim 16, wherein the first mask used in said first exposure step comprises a transmissive membrane and an absorbing material member formed on the membrane in one of a line-and-space pattern, a checkered pattern and a grid-like pattern.

19. A method according to claim 16, wherein a first region having an exposure amount less than an exposure threshold value is produced by said first exposure step, a second region having an exposure amount less than the exposure threshold value is produced by said second exposure step and at least a portion of a third region in which the first and second regions are superposed one upon another has an exposure amount greater than the exposure threshold value.

20. A method according to claim 16, wherein the image of the first mask is formed on the basis of Fresnel diffraction.

21. A method according to claim 16, wherein the first exposure step is carried out plural times while shifting the position of the first mask.

22. A method according to claim 16, wherein at least one of said first and second exposure steps is performed by use of X-rays.

23. A device manufacturing method, comprising the steps of:

performing an exposure process to a workpiece, as recited in claim 16; and developing the exposed workpiece, for forming a circuit pattern on the developed workpiece.

24. A method according to claim 23, wherein at least one of said first and second exposure processes is performed by use of X-rays.

25. A method according to claim 16, wherein the first and second masks are the same mask.

26. A method according to claim 16, wherein the first and second masks are different masks.

27. A device, comprising:

a substrate; and a circuit pattern formed on the substrate though a procedure including (i) an exposure process to a workpiece as recited in claims 16, and (ii) a development process for developing the exposed workpiece, whereby a circuit pattern is formed on the developed workpiece.

28. An exposure apparatus for performing exposure by use of an exposure method as recited in claim 16.

29. An X-ray proximity exposure apparatus, having a shutter for adjusting an exposure amount of X-rays from an X-ray source, which reach a workpiece, wherein said X-ray proximity exposure apparatus performs exposure of the workpiece in accordance with an exposure method as recited in claim 16.

30. An exposure method using a proximity exposure system, said method comprising:

a first exposure step for forming an image of a first mask at a predetermined portion of a workpiece, while maintaining a first spacing between the first mask and the workpiece, wherein the first mask and the image of the first mask include a periodic pattern portion, and the period of the periodic pattern portion the image of the first mask is substantially equal to 1/n times the period of the periodic pattern portion of the first mask, wherein n is an integer not less than 2; and a second exposure step for exposing the predetermined portion of the workpiece, while maintaining a second spacing, different from the first spacing, between a second mask and the workpiece, wherein exposures in the first and second exposure steps are preformed superposedly, prior to a development process, a first region having an exposure amount less than an exposure threshold value is produced by said first exposure step, a second region having an exposure amount less than the exposure threshold value is produced by said second exposure step, and at least a portion of a third region in which the first and second regions are superposed one upon another has an exposure amount greater than the exposure threshold value.

31. A device manufacturing method, comprising the steps of:

performing an exposure process to a workpiece as recited in claim 30; and developing the exposed workpiece, whereby a circuit pattern is formed on the workpiece.

32. A device, comprising:

a substrate; and a circuit pattern formed on the substrate through a procedure including (i) an exposure process to a workpiece as recited in claim 30, and (ii) a development process for developing the exposed workpiece, whereby a circuit pattern is formed on the developed workpiece.

33. An exposure apparatus for performing exposure by use of an exposure method as recited in claim 30.

34. An X-ray proximity exposure apparatus, having a shutter for adjusting an exposure amount of X-rays from an X-ray source, which reach a workpiece, wherein said X-ray proximity exposure apparatus performs exposure of the workpiece in accordance with an exposure method as recited in claim 30.

* * * * *

UNITED STATES PATENT AND TRADEMARK OFFICE
CERTIFICATE OF CORRECTION

PATENT NO.   : 6,324,250 B1
DATED        : November 27, 2001
INVENTOR(S)  : Mitsuaki Amemiya et al.

It is certified that error appears in the above-identified patent and that said Letters Patent is hereby corrected as shown below:

Column 7,
Line 20, "mask-is" should read -- mask is --.

Column 8,
Line 50, "a a" should read -- a --.

Column 9,
Line 19, "a a" should read -- a --.

Column 10,
Line 2, "0.035 micron" should read -- 0.35 micron --.

Column 12,
Line 10, "and" should read -- and high --.

Column 13,
Line 10, "the period of" should be deleted.
Line 16, "for the first" should read -- from the first --.
Line 63, "claim 11," should read -- claim 2, --.

Column 14,
Line 1, "x-ray" should read -- X-ray --.
Line 11, "workpiece," should read -- workpiece; and --.
Line 15, "mask," should read -- mask --.
Line 59, "though" should read -- through --.
Line 61, "claims 16," should read -- claim 16, --.

UNITED STATES PATENT AND TRADEMARK OFFICE
CERTIFICATE OF CORRECTION

PATENT NO.    : 6,324,250 B1
DATED         : November 27, 2001
INVENTOR(S)   : Mitsuaki Amemiya et al.

It is certified that error appears in the above-identified patent and that said Letters Patent is hereby corrected as shown below:

<u>Column 15,</u>
Line 12, "portion" should read -- portion of --.
Line 21, "preformed" should read -- performed --.

Signed and Sealed this

Twenty-seventh Day of August, 2002

*Attest:*

*Attesting Officer*

JAMES E. ROGAN
*Director of the United States Patent and Trademark Office*